United States Patent
Li et al.

(10) Patent No.: US 12,134,097 B2
(45) Date of Patent: Nov. 5, 2024

(54) MICROFLUIDIC CHIP AND FABRICATION METHOD

(71) Applicant: Shanghai Tianma Micro-Electronics Co., Ltd., Shanghai (CN)

(72) Inventors: Wei Li, Shanghai (CN); Baiquan Lin, Shanghai (CN); Kaidi Zhang, Shanghai (CN); Yunfei Bai, Shanghai (CN); Ping Su, Shanghai (CN); Kerui Xi, Shanghai (CN); Zhenyu Jia, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 184 days.

(21) Appl. No.: 17/684,719

(22) Filed: Mar. 2, 2022

(65) Prior Publication Data
US 2023/0211345 A1 Jul. 6, 2023

(30) Foreign Application Priority Data
Dec. 30, 2021 (CN) .......................... 202111647733.0

(51) Int. Cl.
*B01L 3/00* (2006.01)
*B81B 3/00* (2006.01)
*B81C 1/00* (2006.01)

(52) U.S. Cl.
CPC ...... *B01L 3/502784* (2013.01); *B81B 3/0089* (2013.01); *B81C 1/00714* (2013.01); *B01L 2200/12* (2013.01); *B01L 2300/0819* (2013.01); *B01L 2300/161* (2013.01); *B01L 2300/1805* (2013.01); *B01L 2400/0415* (2013.01); *B81B 2201/057* (2013.01); *B81B 2203/0353* (2013.01); *B81C 2201/013* (2013.01); *B81C 2201/0198* (2013.01); *B81C 2201/053* (2013.01)

(58) Field of Classification Search
None
See application file for complete search history.

(56) References Cited

U.S. PATENT DOCUMENTS

2018/0126381 A1* 5/2018 Huff ................. G01N 27/44721
2021/0379594 A1* 12/2021 Gong ................ B01L 3/502707

FOREIGN PATENT DOCUMENTS

| CN | 107051601 B | 7/2019 |
|---|---|---|
| CN | 111167531 A | 5/2020 |
| CN | 111670253 A | 9/2020 |
| CN | 113115586 A | 7/2021 |
| JP | 2017072476 A | 4/2017 |

* cited by examiner

*Primary Examiner* — Jill A Warden
*Assistant Examiner* — Alex Ramirez
(74) *Attorney, Agent, or Firm* — Anova Law Group, PLLC

(57) ABSTRACT

A microfluidic chip and a fabrication method of the microfluidic chip are provided. The microfluidic chip includes an array substrate, and a hydrophobic layer disposed on a side of the array substrate. The hydrophobic layer includes at least one through-hole, and a through-hole of the at least one through-hole penetrates through the hydrophobic layer along a direction perpendicular to a plane of the array substrate. The microfluidic chip also includes at least one hydrophilic structure. A hydrophilic structure of the at least one hydrophilic structure is disposed in the through-hole.

19 Claims, 12 Drawing Sheets

MICROFLUIDIC CHIP AND FABRICATION METHOD

CROSS-REFERENCE TO RELATED APPLICATION

This application claims the priority of Chinese patent application No. 202111647733.0, filed on Dec. 30, 2021, the entirety of which is incorporated herein by reference.

FIELD

The present disclosure generally relates to the field of display technology and, more particularly, relates to a microfluidic chip and a fabrication method.

BACKGROUND

Microfluidic chip technology is a technology that is mainly characterized by the control of fluids in the micronscale space. Microfluidic chip technology is featured with advantages such as less sample consumption, fast analysis speed, suitable for a portable instrument, and suitable for instant and on-site analysis, etc., and has been widely used in many fields such as biology, chemistry and medicine.

However, existing microfluidic chips are mainly used to drive a droplet to flow. Therefore, how to directly detect and observe the droplet in the microfluidic chip is an urgent technical problem that needs to be solved.

SUMMARY

One aspect of the present disclosure provides a microfluidic chip. The microfluidic chip includes an array substrate, and a hydrophobic layer disposed on a side of the array substrate. The hydrophobic layer includes at least one through-hole, and a through-hole of the at least one through-hole penetrates through the hydrophobic layer along a direction perpendicular to a plane of the array substrate. The microfluidic chip also includes at least one hydrophilic structure. A hydrophilic structure of the at least one hydrophilic structure is disposed in the through-hole.

Another aspect of the present disclosure provides a fabrication method of a microfluidic chip. The method includes providing an array substrate, and forming a hydrophilic layer on a side of the array substrate. The method also includes forming a first photoresist pattern on a side of the hydrophilic layer away from the array substrate. The first photoresist pattern corresponds to a region of a to-be-formed hydrophilic structure in the hydrophilic layer. Moreover, the method includes etching the hydrophilic layer using the first photoresist pattern as a mask to form at least one hydrophilic structure, and forming a hydrophobic layer on the side of the array substrate where the at least one hydrophilic structure is formed. The hydrophobic layer includes at least one through-hole, along a direction perpendicular to a plane of the array substrate, a through-hole of the at least one through-hole penetrates through the hydrophobic layer, and a hydrophilic structure of the at least one hydrophilic structure and the first photoresist pattern are located in the through-hole. Further, the method includes removing the first photoresist pattern.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
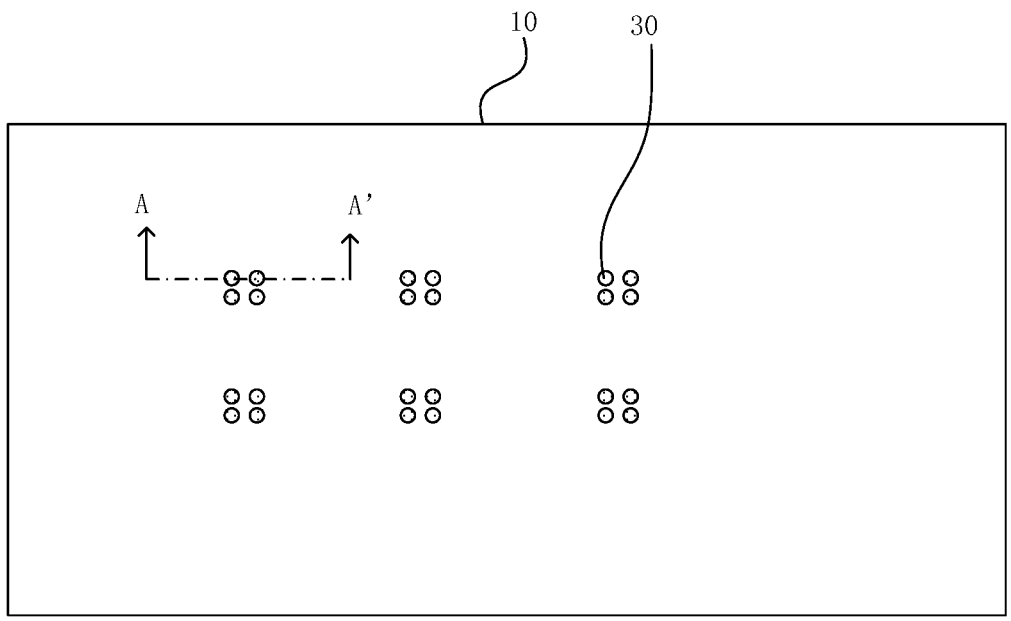
FIG. 1 illustrates a schematic top view of an exemplary microfluidic chip consistent with disclosed embodiments of the present disclosure.
Figure 2:
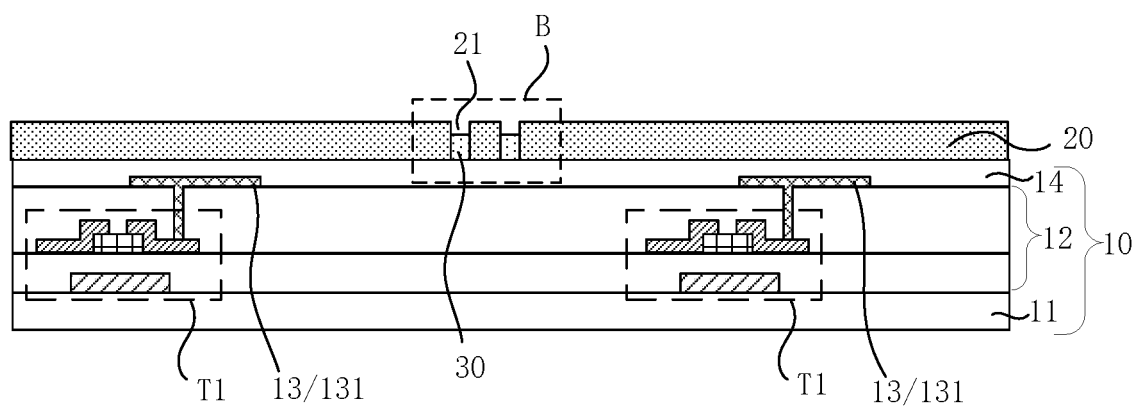
FIG. 2 illustrates an A-A' sectional view of the exemplary microfluidic chip in FIG. 1 consistent with disclosed embodiments of the present disclosure.

The present disclosure provides a microfluidic chip. FIG. 1 illustrates a schematic top view of a microfluidic chip consistent with disclosed embodiments of the present disclosure; and FIG. 2 illustrates an A-A' sectional view of the microfluidic chip in FIG. 1. Referring to FIG. 1 and FIG. 2, the microfluidic chip may include an array substrate 10, and a droplet may be capable of moving on a side of the array substrate 10. In one embodiment, the array substrate 10 may include a plurality of driving electrodes, and an electric field formed between different driving electrodes may drive the droplet to move, such that the droplet may be capable of moving on the array substrate 10.

The microfluidic chip may also include a hydrophobic layer 20. The hydrophobic layer 20 may be located on a side of the array substrate 10. The droplet may be capable of moving on a side of the hydrophobic layer 20 away from the array substrate 10. The disposure of the hydrophobic layer 20 may reduce the adhesion between the droplet and the array substrate 10, and may improve the moving efficiency of the droplet. In one embodiment, the hydrophobic layer 20 may include a Teflon film layer to reduce the adhesion between the droplet and the hydrophobic layer 20, which may not be limited by the present disclosure. In certain embodiments, the hydrophobic layer 20 may include a film layer made of any other material with a hydrophobic function, which may be determined according to practical applications.

The hydrophobic layer 20 may contain at least one through-hole 21. The through-hole 21 may penetrate through the hydrophobic layer 20 in a direction perpendicular to the plane of the array substrate 10. When the droplet moves through the through-hole 21, a bottom of the droplet may be partially retained in the through-hole 21. In other words, a portion of the droplet may be intercepted by the through-hole 21, such that the liquid may be retained in the through-hole 21, and the intercepted liquid may be detected and observed subsequently. In addition, the bottom portion of the droplet may be intercepted by the through-hole 21 for detection and observation without detecting and observing the entire droplet, which may effectively reduce the consumption of reagents and may effectively reduce the production cost.

Further, the microfluidic chip may include at least one hydrophilic structure 30. A hydrophilic structure 30 may be located in the through-hole 21, and the hydrophilic structure 30 may have desired hydrophilicity, such that the adhesion between the hydrophilic structure 30 and the droplet may be substantially large. Through disposing the hydrophilic structure 30 in the through-hole 21, when the droplet moves through the through-hole 21, the hydrophilic structure 30 may stick to the bottom of the droplet, which may facilitate to increase the possibility of the bottom portion of the droplet being retained in the through-hole 21. In other words, the hydrophilic structure 30 may facilitate to intercept the bottom portion of the droplet, such that the liquid may be retained on the side of the hydrophilic structure 30 away from the array substrate 10, and the intercepted liquid may be detected and observed subsequently.

In certain embodiments, the hydrophilic structure 30 may be made of one or more of silicon oxide, silicon nitride, polyvinylpyrrolidone and sodium hydroxide. Silicon oxide, silicon nitride, polyvinylpyrrolidone and sodium hydroxide may have desired hydrophilicity, and the hydrophilic structure 30 made of silicon oxide, silicon nitride and polyvinylpyrrolidone may effectively increase the adhesion between the droplet and the hydrophilic structure 30, which may facilitate for the hydrophilic structure 30 to intercept the droplet. Therefore, the liquid may be retained on the side of the hydrophilic structure 30 away from the array substrate 10, and the intercepted liquid may be detected and observed subsequently. When silicon oxide is used to form the hydrophilic structure 30, hydrophilic groups may be further formed on the silicon oxide. For example, hydrophilicity of the hydrophilic structure 30 may further increase by a material containing hydrophilic groups such as sodium hydroxide. It should be noted that in certain embodiments, the hydrophilic structure 30 may be made of any other hydrophilic material, which may be determined according to practical applications, and may not be repeated herein.

Figure 3:
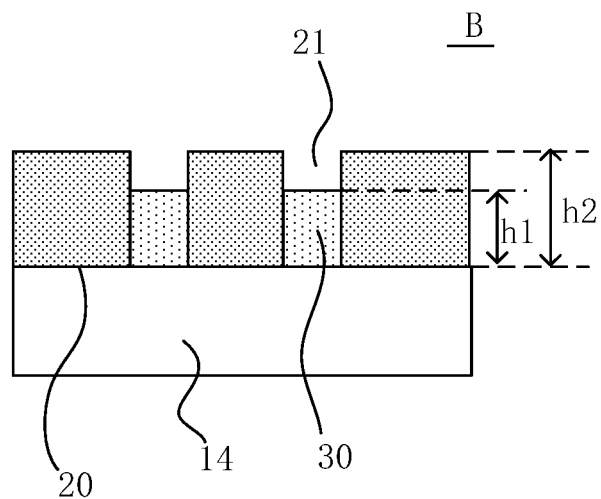
FIG. 3 illustrates a zoom-in view of region B in the exemplary microfluidic chip in FIG. 2 consistent with disclosed embodiments of the present disclosure.

FIG. 3 illustrates a zoom-in view of region B in the microfluidic chip in FIG. 2. Referring to FIG. 3, in one embodiment, along the direction perpendicular to the plane of the array substrate 10, the hydrophilic structure 30 may have a height of h1, and the through-hole 21 may have a height of h2, where h2>h1. The height of the through-hole 21 in the direction perpendicular to the plane of the array substrate 10 may be greater than the height of the hydrophilic structure 30 in the direction perpendicular to the plane of the array substrate 10. Therefore, when the hydrophilic structure 30 is disposed in the through-hole 21, the hydrophilic structure 30 and the through-hole 21 may form a groove structure. When the droplet moves through the through-hole 21, the groove structure formed by the hydrophilic structure 30 and the through-hole 21 may facilitate for the bottom portion of the droplet to be retained in the through-hole 21, and may facilitate to intercept the bottom portion of the droplet. Therefore, the liquid may be intercepted in the through-hole 21 and on the side of the hydrophilic structure 30 away from the array substrate 10, and the intercepted liquid may be detected and observed subsequently.

In certain embodiments, h2−h1≥1 μm. In the direction perpendicular to the plane of the array substrate 10, a height difference between the hydrophilic structure 30 and the through-hole 21 may be greater than or equal to 1 μm. In other words, the groove structure formed by the hydrophilic structure 30 and the through-hole 21 may have a depth along the direction perpendicular to the plane of the array substrate 10 greater than or equal to 1 μm. When the droplet moves through the through-hole 21, the bottom portion of the droplet may be effectively intercepted.

It should be noted that the present embodiment may exemplarily illustrate that along the direction perpendicular to the plane of the array substrate 10, the height difference between the hydrophilic structure 30 and the through-hole 21 may be greater than or equal to 1 μm. In certain embodiments, along the direction perpendicular to the plane of the array substrate 10, the height difference between the hydrophilic structure 30 and the through-hole 21 may be determined according to practical applications, which may not be repeated herein.

Figure 4:
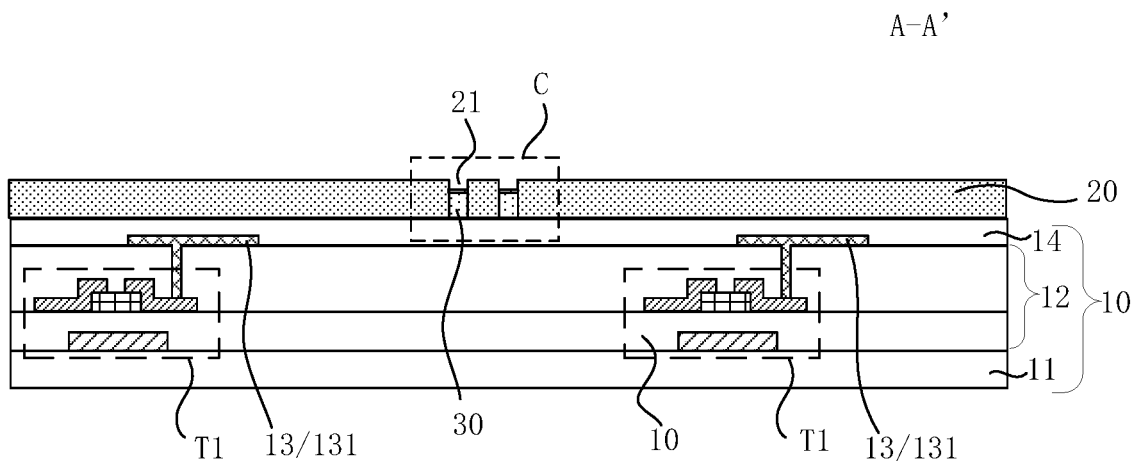
FIG. 4 illustrates another A-A' sectional view of the exemplary microfluidic chip in FIG. 1 consistent with disclosed embodiments of the present disclosure.
Figure 5:
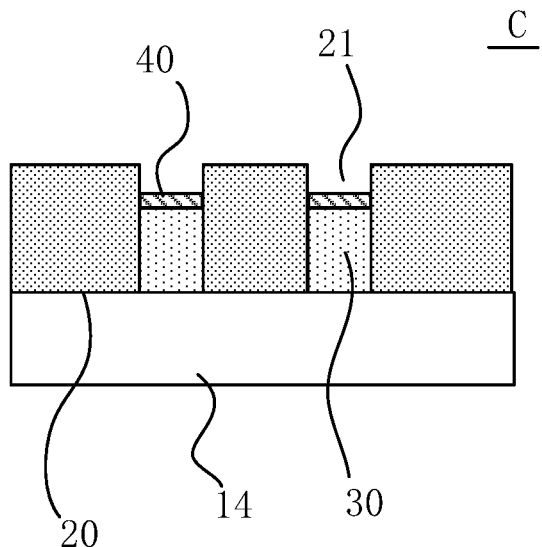
FIG. 5 illustrates a zoom-in view of region C in the exemplary microfluidic chip in FIG. 4 consistent with disclosed embodiments of the present disclosure.

FIG. 4 illustrates another A-A' sectional view of the microfluidic chip in FIG. 1; and FIG. 5 illustrates a zoom-in view of region C in the microfluidic chip in FIG. 4. Referring to FIG. 4 and FIG. 5, in certain embodiments, a reaction material 40 may be disposed on the side of the hydrophilic structure 30 away from the array substrate 10. When the droplet moves through the through-hole 21, the bottom portion of the droplet may be retained in the through-hole 21 and on the side of the hydrophilic structure 30 away from the array substrate 10. The reaction material 40 may be disposed on the side of the hydrophilic structure 30 away from the array substrate 10, such that the retained liquid may directly react with the reaction material 40. Therefore, the quantitative detection of the liquid may be achieved on the microfluidic chip, which may simplify the operation steps, may reduce the operation cost, and may facilitate to achieve real-time detection.

Referring to FIG. 4 and FIG. 5, in certain embodiments, along the direction perpendicular to the plane of the array substrate 10, a sum of a height of the reaction material 40 and the height of the hydrophilic structure 30 may be less than the height of the through-hole 21. Therefore, when the hydrophilic structure 30 and the reaction material 40 are disposed in the through-hole 21, the hydrophilic structure 30, the reaction material 40 and the through-hole 21 may form a groove structure. When the droplet moves through the through-hole 21, the groove structure formed by the hydrophilic structure 30, the reaction material 40 and the through-hole 21 may facilitate for the bottom portion of the droplet to be retained in the through-hole 21, which may facilitate to intercept the bottom portion of the droplet. Therefore, the liquid may be retained in the through-hole 21 and on the side of the hydrophilic structure 30 away from the array substrate 10, and the retained liquid may directly react with the reaction material 40 to achieve the quantitative detection of the liquid.

It should be noted that to clearly illustrate the positional relationship between the reaction material 40 and the hydrophilic structure 30, FIG. 4 and FIG. 5 may exemplarily illustrate that the reaction material 40 may cover the entire hydrophilic structure 30. In the actual production process, the side of the hydrophilic structure 30 away from the array substrate 10 may be subjected to a soaking reaction, the side of the hydrophilic structure 30 away from the array substrate 10 may be immersed in the reaction solution, and then the reaction solution may be volatilized, such that some chemical groups may be grown on the side surface of the hydrophilic structure 30 away from the array substrate 10. Such chemical groups may form the reaction material 40, which may not cover the entire hydrophilic structure 30, such that the reaction material 40 may have little influence on the hydrophilicity of the hydrophilic structure 30. In certain embodiments, the reaction material 40 may also be formed on the side of the hydrophilic structure 30 away from the array substrate 10 by any other method, which may not be described in detail herein.

Referring to FIG. 2, in one embodiment, the array substrate 10 may include a base substrate 11, a circuit layer 12, an electrode layer 13 and an insulating layer 14. The circuit layer 12 may be disposed on a side of the base substrate 11, and the circuit layer 12 may include a plurality of first transistors T1. The electrode layer 13 may be disposed on a side of the circuit layer 12 away from the base substrate 11, and the electrode layer 13 may include a plurality of driving electrodes 131. The driving electrodes 131 may be insulated from each other, and each driving electrode 131 may be electrically connected to a different first transistor T1. A voltage signal may be applied to the driving electrode 131 through a corresponding first transistor T1 electrically connected to the driving electrode 131, and the droplet may be driven to move by an electric field formed between different driving electrodes 131, thereby achieving the movement of the droplet on the array substrate 10.

Exemplarily, by applying different voltage signals to two adjacent driving electrodes 131, an electric field may be formed between the two driving electrodes 131. When the voltage difference between the two driving electrodes 131 is greater than a threshold voltage capable of driving the droplet to move, the electric field formed between the two driving electrodes 131 may generate a pressure difference and asymmetric deformation inside the droplet, such that the droplet may move between the two driving electrodes 131.

In one embodiment, the driving electrode 131 may be made of a material including a semiconductor material or a metal material. Exemplarily, the driving electrode 131 may be made of a material including indium tin oxide, molybdenum, etc.

The insulating layer 14 may be disposed on a side of the electrode layer 13 away from the base substrate 11, and the hydrophobic layer 20 may be disposed on a side of the insulating layer 14 away from the base substrate 11. The insulating layer 14 may be located between the electrode layer 13 and the hydrophobic layer 20. The insulating layer 14 may have the effect of planarization, which may facilitate to subsequently dispose the hydrophobic layer 20, and at the same time, may insulate the driving electrodes 131.

In one embodiment, the circuit layer 12 may further include a first signal line (not shown in the Figure) and a second signal line (not shown in the Figure). Through the first signal line, a signal may be applied to make the first transistor T1 electrically connected to the first signal line be turned-on or turned-off. When the first transistor T1 is turned on, through the second signal line, a voltage signal may be applied to the driving electrode 131 electrically connected to the first transistor T1. It should be understood that the array substrate 10 may further include other film layer structures such as a gate insulating layer and an interlayer insulating layer, which may not be described in detail herein.

Referring to FIG. 2, in certain embodiments, in a plane parallel to the base substrate 11, at least one hydrophilic structure 30 may be disposed between two adjacent driving electrodes 131. When the droplet moves from a position above one driving electrode 131 to another position above another driving electrode 131, the droplet may move through the through-hole 21, and the hydrophilic structure 30 in the through-hole 21 may stick to the bottom portion of the droplet, such that the bottom portion of the droplet may be intercepted. Therefore, liquid may be intercepted on the side of the hydrophilic structure 30 away from the array substrate 10, and the retained liquid may be detected and observed subsequently.

Figure 6:
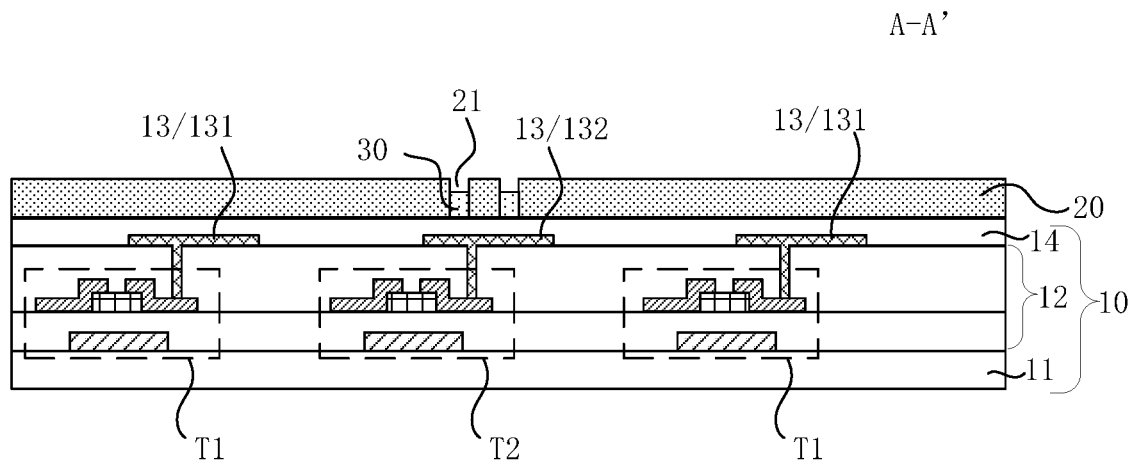
FIG. 6 illustrates another A-A' sectional view of the exemplary microfluidic chip in FIG. 1 consistent with disclosed embodiments of the present disclosure.

FIG. 6 illustrates another A-A' sectional view of the microfluidic chip in FIG. 1. Referring to FIG. 6, in certain embodiments, the circuit layer 12 may further include at least one second transistor T2, and the electrode layer 13 may further include at least one heating electrode 132. The heating electrode 132 may be electrically connected to the second transistor T2. Along the direction perpendicular to the plane of the array substrate 10, at least one hydrophilic structure 30 may at least partially overlap one heating electrode 132, and at least one hydrophilic structure 30 may be disposed in a region corresponding to the heating electrode 132 in the microfluidic chip. A voltage signal may be applied to the heating electrode 132 through the corresponding second transistor T2 electrically connected to the heating electrode 132, such that the temperature of the region corresponding to the heating electrode 132 may vary. When the liquid is retained on the side of the hydrophilic structure 30 away from the array substrate 10, the temperature of the liquid retained on the side of the hydrophilic structure 30 away from the array substrate 10 may be controlled by the heating electrode 132, to detect the liquid trapped by the hydrophilic structure 30 at a specific temperature.

In one embodiment, in a digital PCR (absolute quantification of nucleic acid molecules) amplification reaction, in an ideal condition, each droplet may contain a to-be-tested DNA strand, and a reaction solvent containing a PCR reaction buffer (including four kinds of dNTP with fluorophores) and DNA polymerase. Three temperature changes in the PCR may be controlled by the heating electrode 132 under the hydrophilic structure 30, thereby achieving the PCR amplification.

In one embodiment, the heating electrode 132 may be made of a metal. Exemplarily, the heating electrode 132 may be made of molybdenum, etc.

In one embodiment, the driving electrode 131 and the heating electrode 132 may be made of a same material and may be formed by a same mask process, which may effectively reduce the manufacturing processes and may reduce the production cost.

Figure 7:
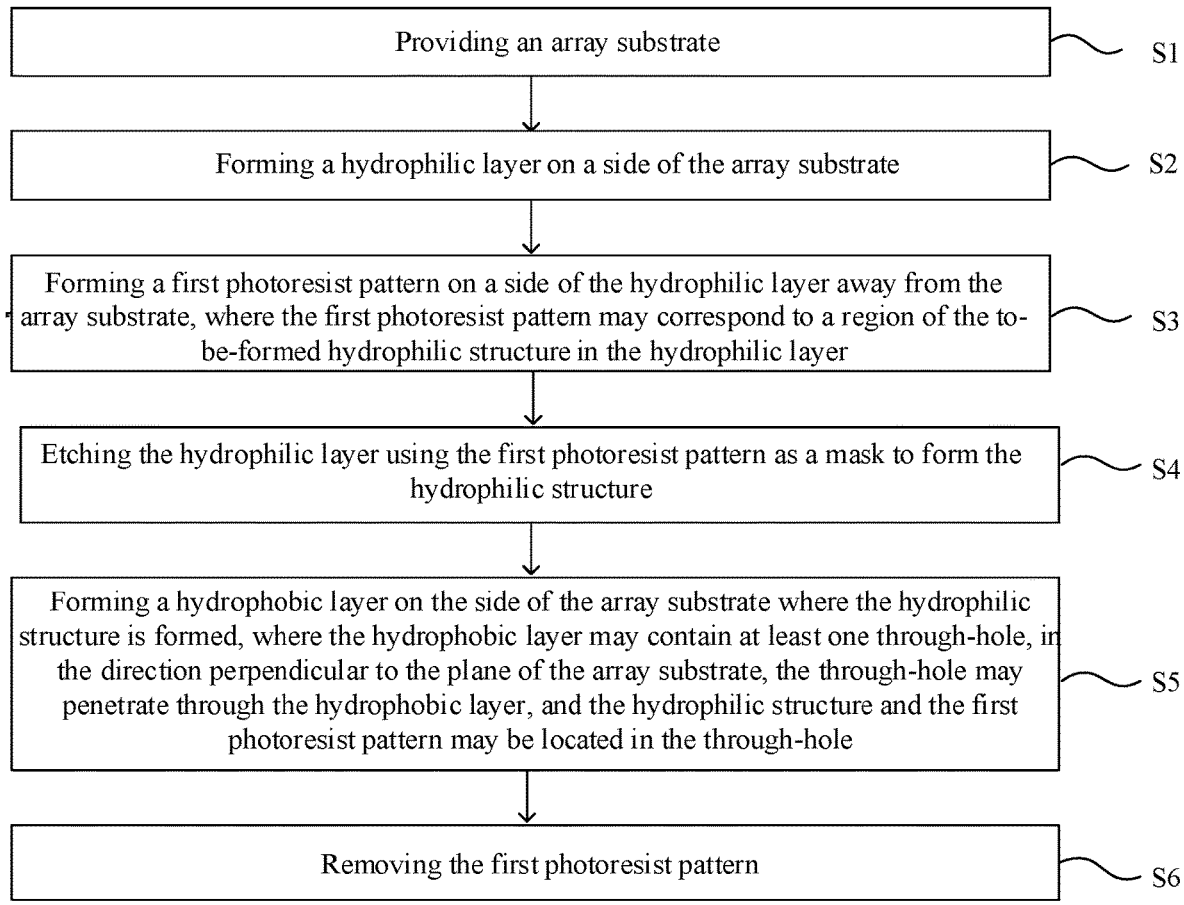
FIG. 7 illustrates a schematic flowchart of an exemplary fabrication method of a microfluidic chip consistent with disclosed embodiments of the present disclosure.

The present disclosure provides a fabrication method of a microfluidic chip. FIG. 7 illustrates a schematic flowchart of a fabrication method of a microfluidic chip consistent with disclosed embodiments of the present disclosure; and FIGS. 8-11 illustrate semiconductor structures corresponding to certain stages of the fabrication method of the microfluidic chip. Referring to FIGS. 7-11, the fabrication method may include following.

S1: Providing an array substrate.

S2: Forming a hydrophilic layer on a side of the array substrate.

Figure 8:
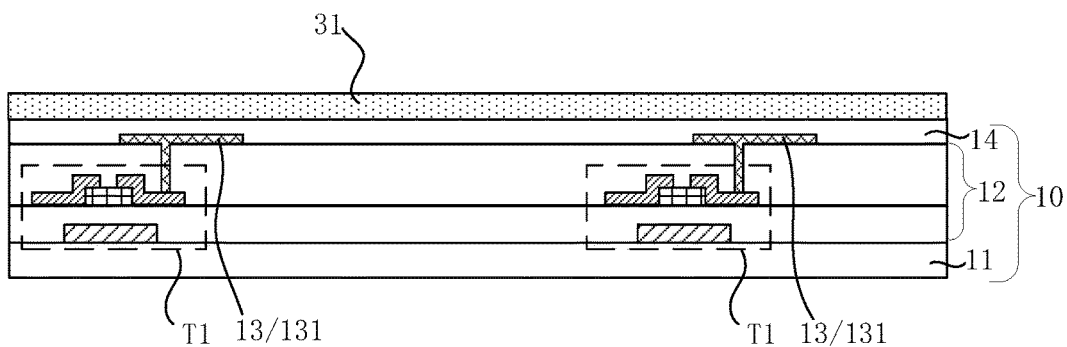
FIGS. 8-11 illustrate semiconductor structures corresponding to certain stages of an exemplary fabrication method of a microfluidic chip consistent with various disclosed embodiments of the present disclosure.

Referring to FIG. 8, a hydrophilic layer 31 may be formed on a side of the array substrate 10. The hydrophilic layer 31 may have desired hydrophilicity. In one embodiment, the hydrophilic layer 31 may be made of one or more of silicon oxide, silicon nitride, polyvinylpyrrolidone and sodium hydroxide.

S3: Forming a first photoresist pattern on a side of the hydrophilic layer away from the array substrate, where the first photoresist pattern may correspond to a region of the to-be-formed hydrophilic structure in the hydrophilic layer.

Figure 9:
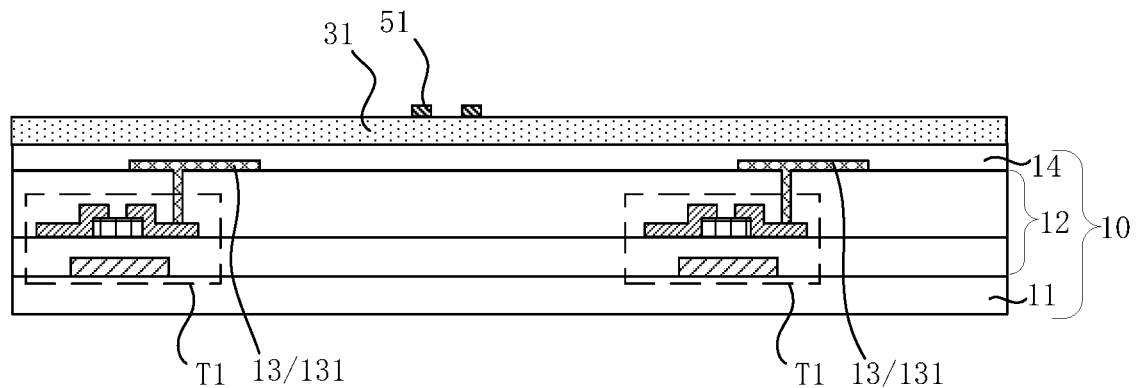

Referring to FIG. 9, a first photoresist pattern 51 may be formed on the side of the hydrophilic layer 31 away from the array substrate 10, and the first photoresist pattern 51 may cover the region of the to-be-formed hydrophilic structure in the hydrophilic layer 31.

S4: Etching the hydrophilic layer using the first photoresist pattern as a mask to form the hydrophilic structure.

Figure 10:
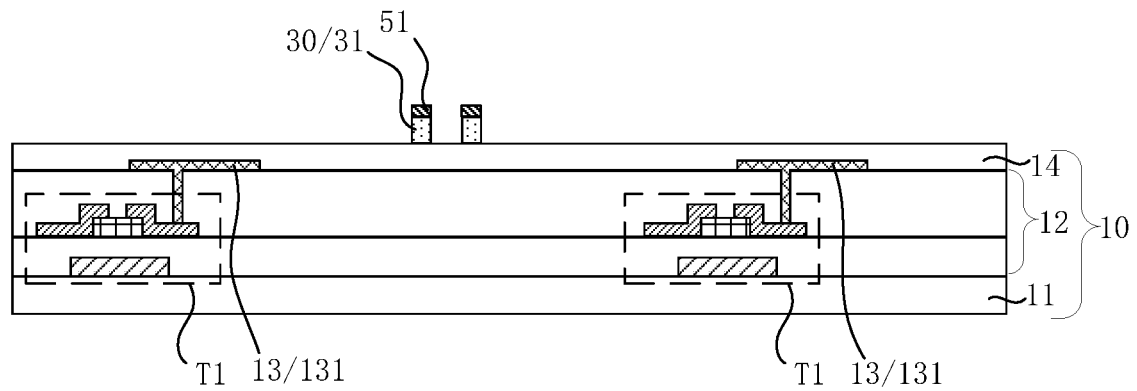

Referring to FIG. 10, because the first photoresist pattern 51 covers the region of the to-be-formed hydrophilic structure in the hydrophilic layer 31, when the hydrophilic layer 31 is etched using the first photoresist pattern 51 as a mask, the region of the to-be-formed hydrophilic structure in the hydrophilic layer 31 may not be etched, and any other region in the hydrophilic layer 31 may be etched away, such that the hydrophilic structure 30 may be formed on a side of the array substrate 10.

S5: Forming a hydrophobic layer on the side of the array substrate where the hydrophilic structure is formed, where the hydrophobic layer may contain at least one through-hole, in the direction perpendicular to the plane of the array substrate, the through-hole may penetrate through the hydrophobic layer, and the hydrophilic structure and the first photoresist pattern may be located in the through-hole.

Figure 11:
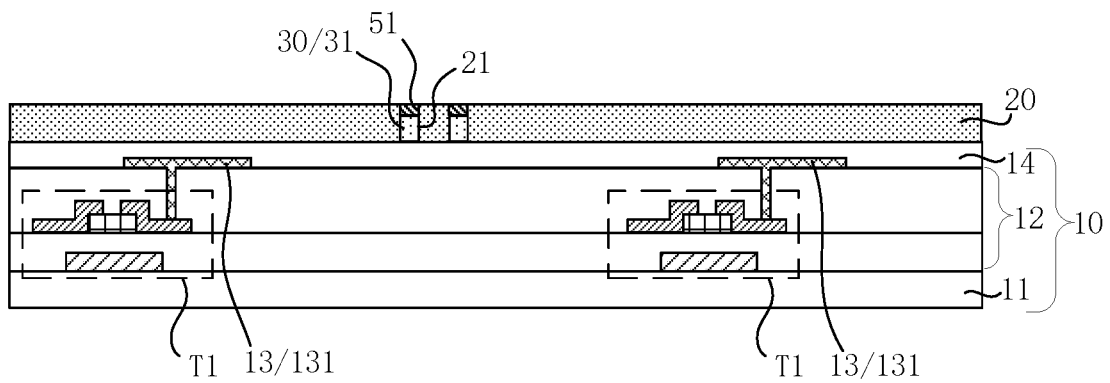

Referring to FIG. 11, a hydrophobic layer 20 may be formed on the side of the array substrate 10 where the hydrophilic structure 30 is formed. Due to the existence of the hydrophilic structure 30 and the first photoresist pattern 51, the through-hole 21 may be formed in the hydrophobic layer 20 at a region where the hydrophilic structure 30 and the first photoresist pattern 51 are located. The hydrophilic structure 30 and the first photoresist pattern 51 may be located in the through-hole 21.

S6: Removing the first photoresist pattern.

Referring to FIG. 2, after removing the first photoresist pattern, the hydrophilic structure 30 may be located in the through-hole 21. The hydrophilic structure 30 may have desired hydrophilicity, such that the adhesion between the hydrophilic structure 30 and the droplet may be substantially large. When the droplet moves through the through-hole 21, the hydrophilic structure 30 may stick to the bottom of the droplet, which may facilitate the bottom portion of the droplet to be retained in the through-hole 21. In other words, the hydrophilic structure 30 may facilitate to intercept the bottom portion of the droplet, such that the liquid may be retained on the side of the hydrophilic structure 30 away from the array substrate 10, and the intercepted liquid may be detected and observed subsequently.

Referring to FIG. 2 and FIG. 3, in one embodiment, along the direction perpendicular to the plane of the array substrate 10, the hydrophilic structure 30 may have a height of h1, and the through-hole 21 may have a height of h2, where h2>h1. Along the direction perpendicular to the plane of the array substrate 10, a sum of the height of the hydrophilic structure 30 and a height of the first photoresist pattern 51 may tend to be the same as the height of the through-hole 21. After removing the first photoresist pattern 51, along the direction perpendicular to the plane of the array substrate 10, the height of the hydrophilic structure 30 may be smaller than the height of the through-hole 21. Therefore, the hydrophilic structure 30 and the through-hole 21 may form a groove structure. When the droplet moves through the through-hole 21, the groove structure formed by the hydrophilic structure 30 and the through-hole 21 may facilitate for the bottom portion of the droplet to be retained in the through-hole 21, and may facilitate to intercept the bottom portion of the droplet. Therefore, the liquid may be intercepted in the through-hole 21 and on the side of the hydrophilic structure 30 away from the array substrate 10, and the intercepted liquid may be detected and observed subsequently.

Figure 12:
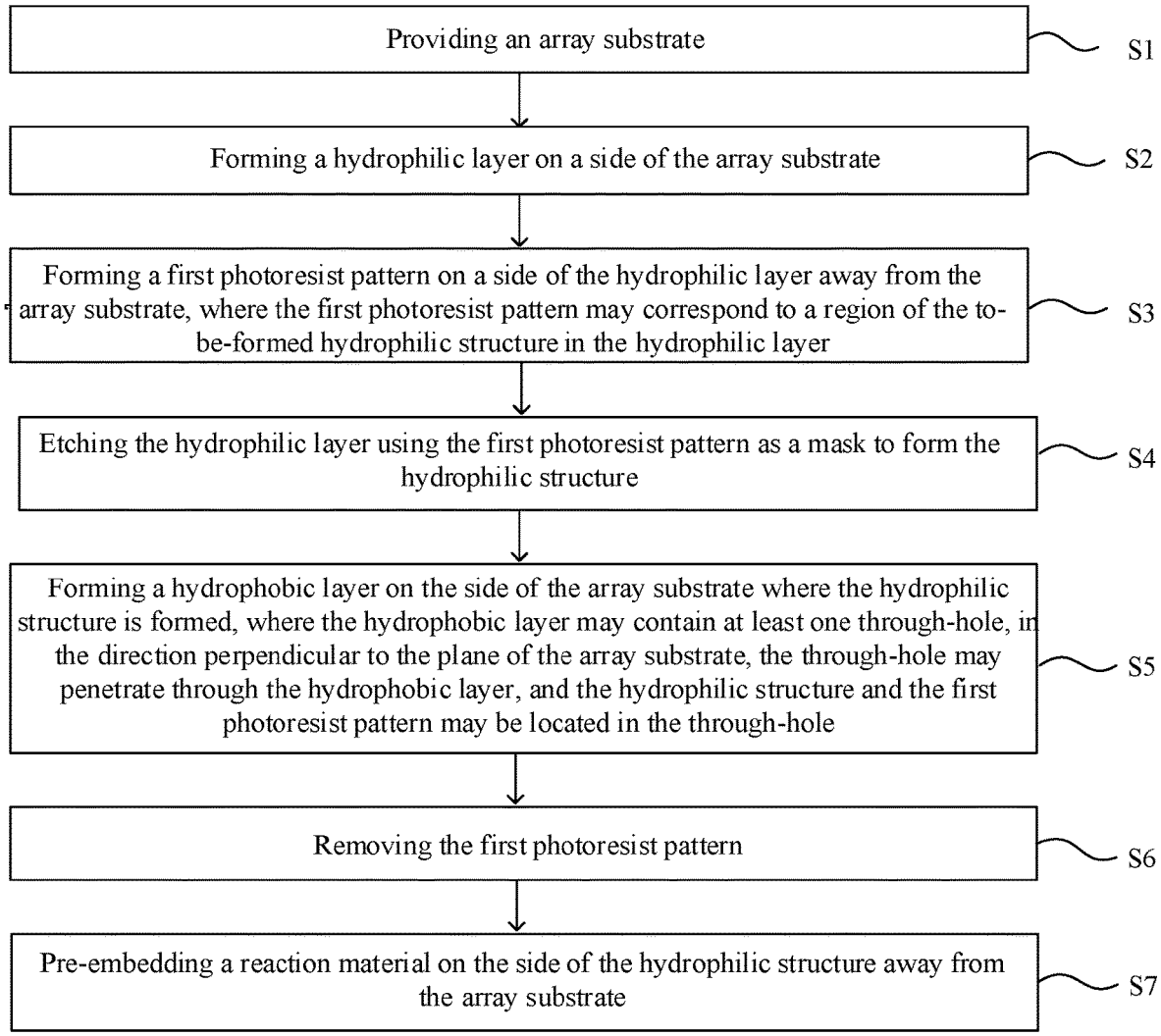
FIG. 12 illustrates a schematic flowchart of another exemplary fabrication method of a microfluidic chip consistent with disclosed embodiments of the present disclosure.

FIG. 12 illustrates a schematic flowchart of another fabrication method of a microfluidic chip consistent with disclosed embodiments of the present disclosure. Referring to FIG. 12, in one embodiment, the fabrication method of the microfluidic chip may further include following.

S7: Pre-embedding a reaction material on the side of the hydrophilic structure away from the array substrate.

Referring to FIG. 4 and FIG. 5, a reaction material 40 may be disposed on the side of the hydrophilic structure 30 away from the array substrate 10. When the droplet moves through the through-hole 21, the bottom portion of the droplet may be retained in the through-hole 21 and on the side of the hydrophilic structure 30 away from the array substrate 10. The reaction material 40 may be disposed on the side of the hydrophilic structure 30 away from the array substrate 10, such that the retained liquid may directly react with the reaction material 40. Therefore, the quantitative detection of the liquid may be achieved on the microfluidic chip, which may simplify the operation steps, may reduce the operation cost, and may facilitate to achieve real-time detection.

Figure 13:
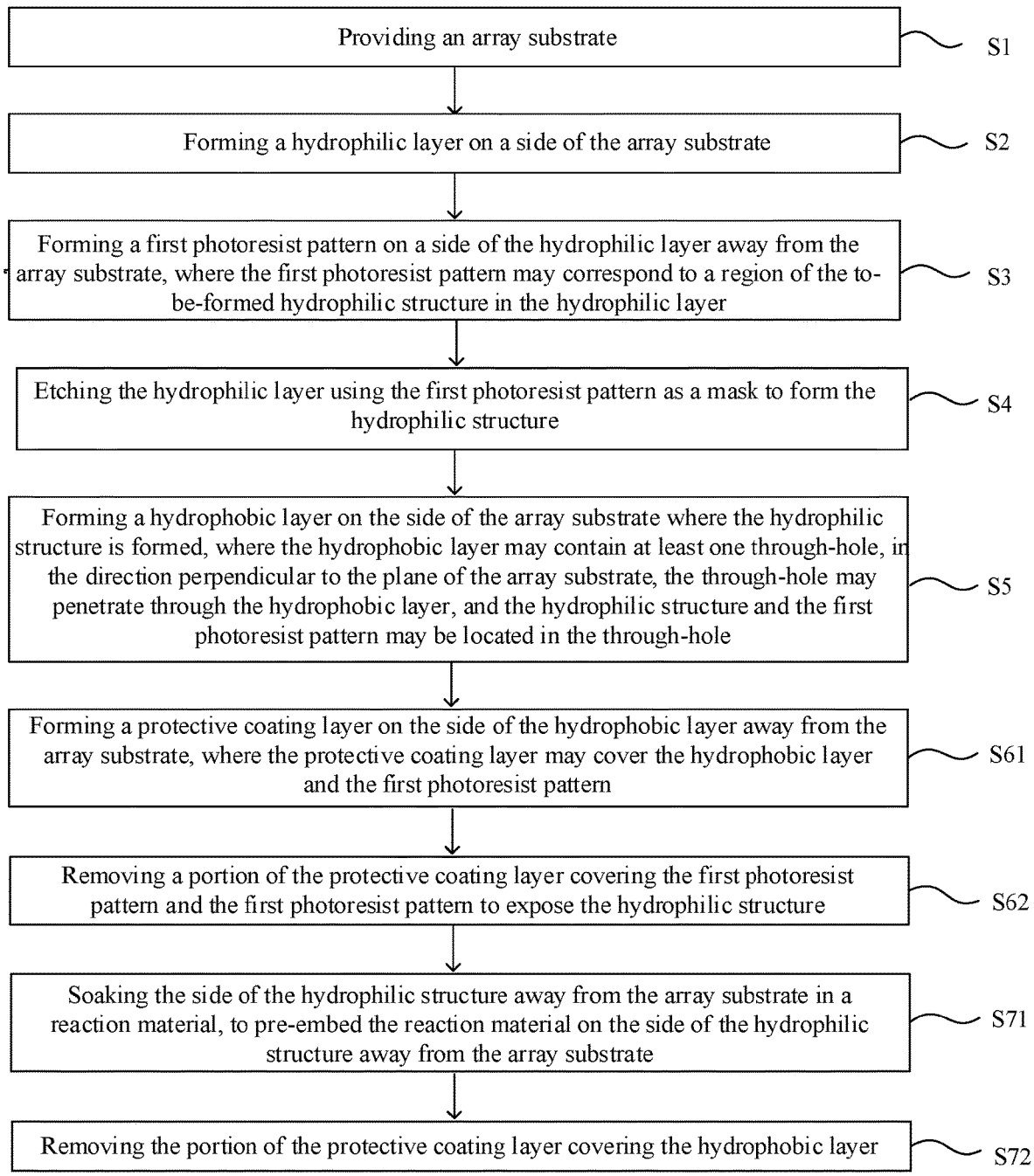
FIG. 13 illustrates a schematic flowchart of another exemplary fabrication method of a microfluidic chip consistent with disclosed embodiments of the present disclosure.
Figure 14:
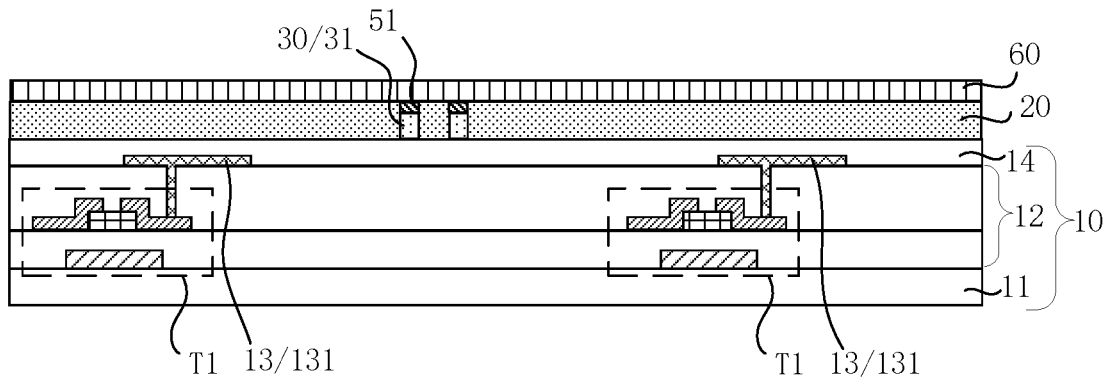
FIGS. 14-16 illustrate semiconductor structures corresponding to certain stages of another exemplary fabrication method of a microfluidic chip consistent with various disclosed embodiments of the present disclosure.
Figure 15:
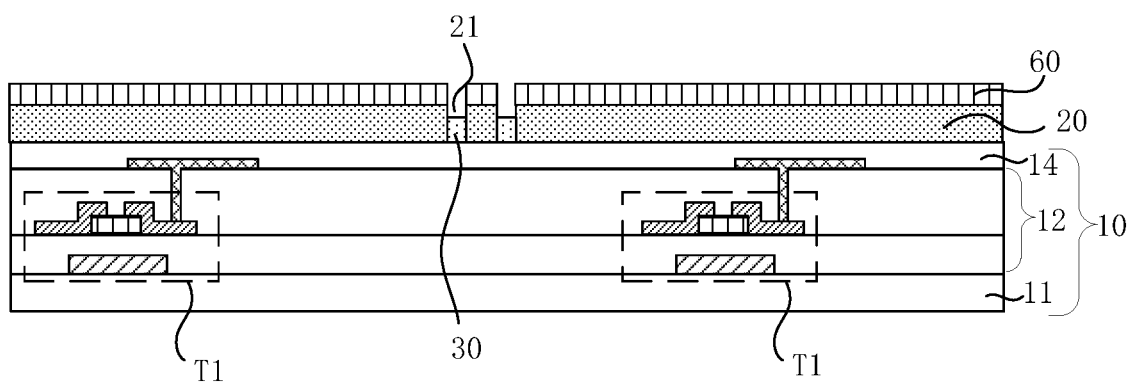
Figure 16:
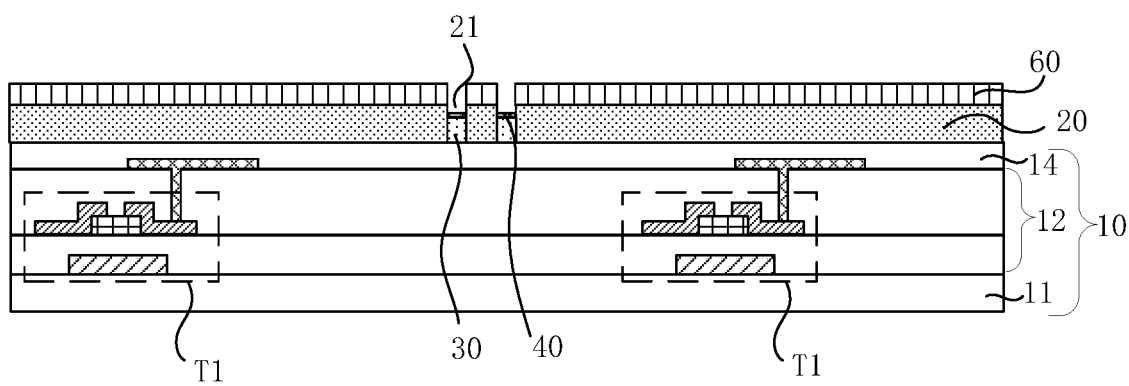

FIG. 13 illustrates a schematic flowchart of another fabrication method of a microfluidic chip consistent with disclosed embodiments of the present disclosure; and FIGS. 14-16 illustrate semiconductor structures corresponding to certain stages of the fabrication method of the microfluidic chip. Referring to FIGS. 13-16, in one embodiment, before removing the first photoresist pattern, the fabrication method of the microfluidic chip may further include following.

S61: Forming a protective coating layer on the side of the hydrophobic layer away from the array substrate, where the protective coating layer may cover the hydrophobic layer and the first photoresist pattern.

Referring to FIG. 14, a protective coating layer 60 may be formed on the side of the hydrophobic layer 20 away from the array substrate 10, and the protective coating layer 60 may cover the hydrophobic layer 20 and the first photoresist pattern 51.

S62: Removing a portion of the protective coating layer covering the first photoresist pattern and the first photoresist pattern to expose the hydrophilic structure.

Referring to FIG. 15, the portion of the protective coating layer 60 covering the first photoresist pattern 51 and the first photoresist pattern 51 may be removed to expose the hydrophilic structure 30. The protective coating layer 60 covering the hydrophobic layer 20 may not need to be removed, and may still cover the hydrophobic layer 20.

S71: Soaking the side of the hydrophilic structure away from the array substrate in a reaction material, to pre-embed the reaction material on the side of the hydrophilic structure away from the array substrate.

Referring to FIG. 16, the side of the hydrophilic structure 30 away from the array substrate 10 may be soaked in the reaction material, such that the reaction material 40 may be pre-embedded on the side of the hydrophilic structure 30 away from the array substrate 10. Because the protective coating layer 60 covers the hydrophobic layer 20, when the side of the hydrophilic structure 30 away from the array substrate 10 is soaked in the reactive material, the reactive material may merely be adhered to the protective coating layer 60 while may not be adhered to the hydrophobic layer 20, such that the reactive material may be prevented from being disposed on the hydrophobic layer 20, and the droplet may be prevented from being reacted with the reaction material when moving on the hydrophobic layer 20 to affect the detection accuracy.

S72: Removing the portion of the protective coating layer covering the hydrophobic layer.

Referring to FIG. 4 and FIG. 5, the reaction material 40 may merely be disposed on the side of the hydrophilic structure 30 away from the array substrate 10, and the reaction material 40 may not be disposed on the hydrophobic layer 20.

In one embodiment, the protective coating layer 60 may be made of parylene, which may protect the hydrophobic layer 20 and may facilitate peeling. In another embodiment, the protective coating layer 60 may be made of any other peelable material, which may not be described in detail herein.

Figure 17:
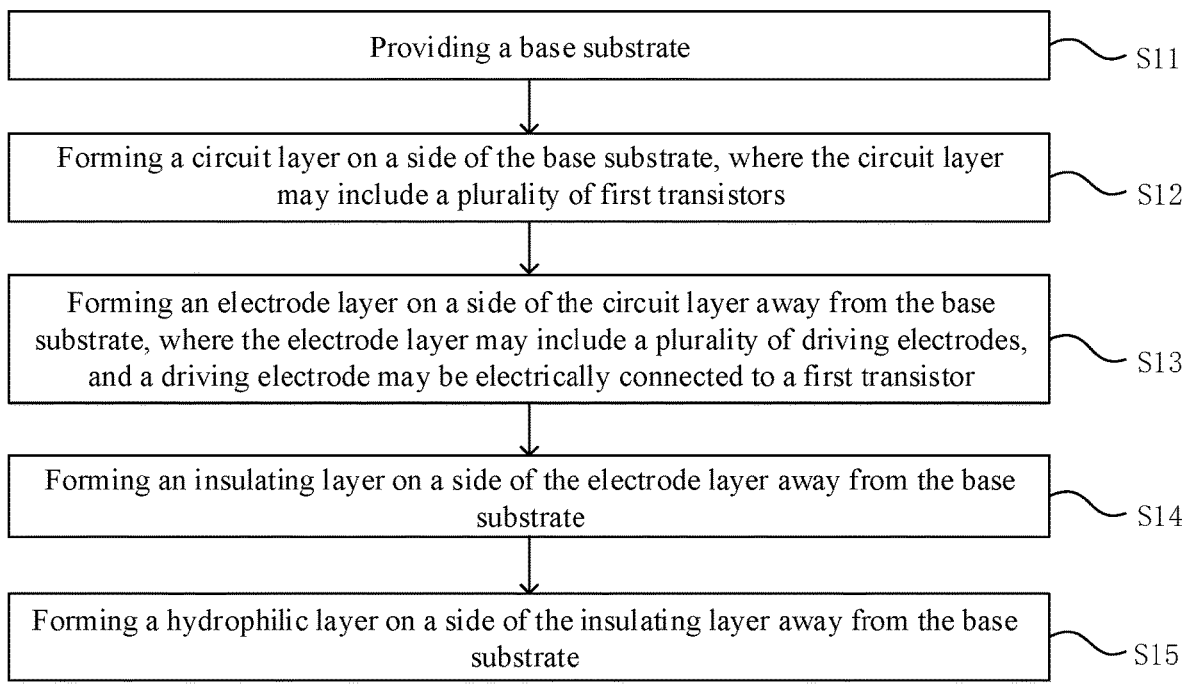
FIG. 17 illustrates a schematic flowchart of an exemplary fabrication method of an array substrate consistent with disclosed embodiments of the present disclosure.

FIG. 17 illustrates a schematic flowchart of a fabrication method of an array substrate consistent with disclosed embodiments of the present disclosure. Referring to FIG. 17, in one embodiment, the fabrication method of the array substrate may include following.

S11: Providing a base substrate.

S12: Forming a circuit layer on a side of the base substrate, where the circuit layer may include a plurality of first transistors.

S13: Forming an electrode layer on a side of the circuit layer away from the base substrate, where the electrode layer may include a plurality of driving electrodes, and a driving electrode may be electrically connected to a first transistor.

S14: Forming an insulating layer on a side of the electrode layer away from the base substrate.

S15: Forming a hydrophilic layer on a side of the insulating layer away from the base substrate.

Referring to FIG. 2, the array substrate 10 may include a base substrate 11, a circuit layer 12, an electrode layer 13 and an insulating layer 14. The circuit layer 12 may be disposed on a side of the base substrate 11, and the circuit layer 12 may include a plurality of first transistors T1. The electrode layer 13 may be disposed on the side of the circuit layer 12 away from the base substrate 11, and the electrode layer 13 may include a plurality of driving electrodes 131. The driving electrodes 131 may be insulated from each other, and each driving electrode 131 may be electrically connected to a different first transistor T1. A voltage signal may be applied to the driving electrode 131 through a corresponding first transistor T1 electrically connected to the driving electrode 131, and the droplet may be driven to move by an electric field formed between different driving electrodes 131, thereby achieving the movement of the droplet on the array substrate 10.

Exemplarily, by applying different voltage signals to adjacent two driving electrodes 131, an electric field may be formed between the two driving electrodes 131. When the voltage difference between the two driving electrodes 131 is greater than a threshold voltage capable of driving the droplet to move, the electric field formed between the two driving electrodes 131 may generate a pressure difference and asymmetric deformation inside the droplet, such that the droplet may move between the two driving electrodes 131.

In one embodiment, the driving electrode 131 may be made of a material including a semiconductor material or a metal material. Exemplarily, the driving electrode 131 may be made of a material including indium tin oxide, molybdenum, etc.

The insulating layer 14 may be disposed on the side of the electrode layer 13 away from the base substrate 11, and the hydrophobic layer may be disposed on the side of the insulating layer 14 away from the base substrate 11. The insulating layer 14 may have the effect of planarization, which may facilitate to subsequently dispose the hydrophobic layer, and at the same time, may insulate the driving electrodes 131.

Referring to FIG. 2, in one embodiment, in a plane parallel to the base substrate 11, at least one hydrophilic structure 30 may be disposed between two adjacent driving electrodes 131. When the droplet moves from a position above one driving electrode 131 to another position above another driving electrode 131, the droplet may move through the through-hole 21, and the hydrophilic structure 30 in the through-hole 21 may stick to the bottom portion of the droplet, such that the bottom portion of the droplet may be intercepted. Therefore, liquid may be intercepted on the side of the hydrophilic structure 30 away from the array substrate 10, and the retained liquid may be detected and observed subsequently.

Figure 18:
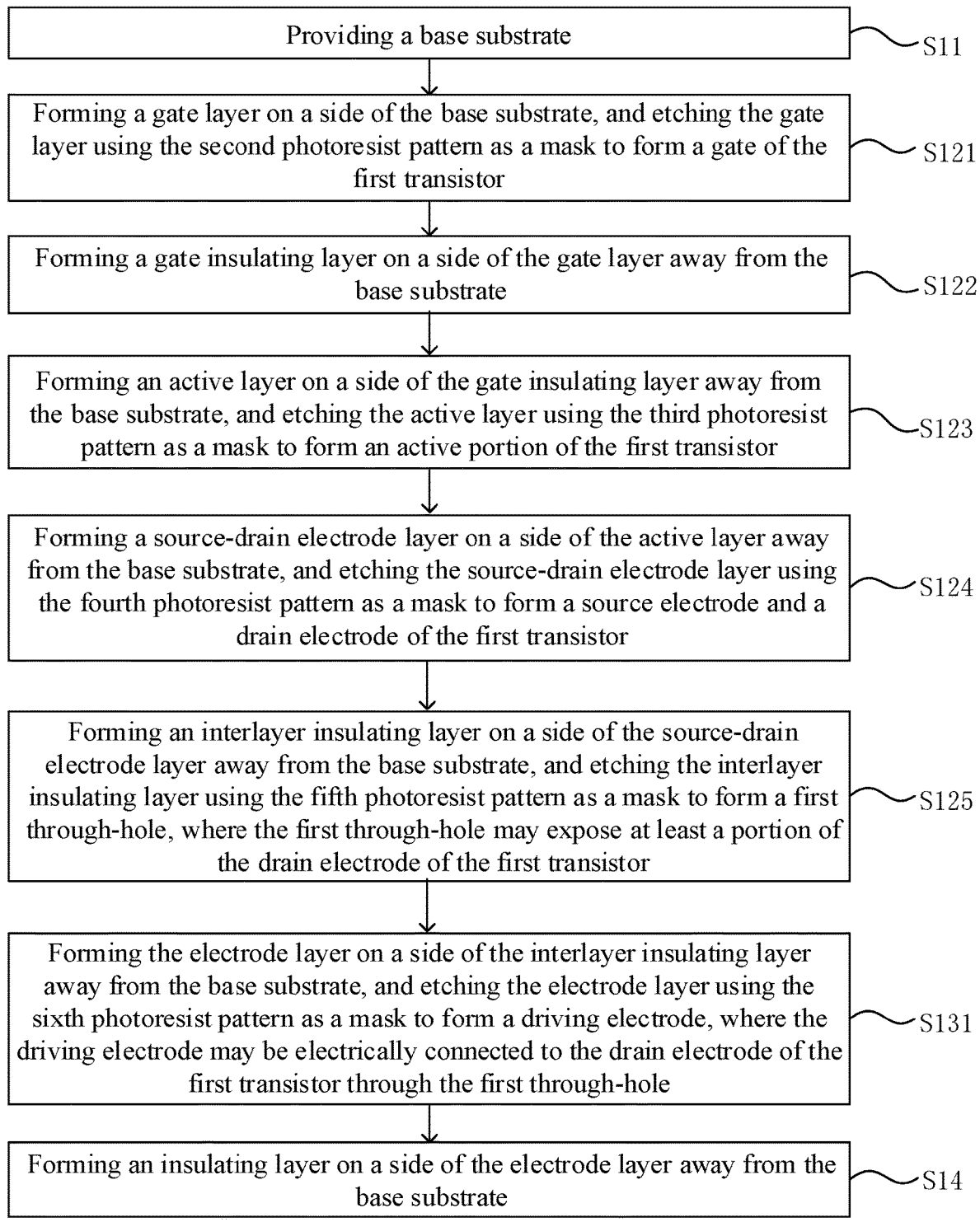
FIG. 18 illustrates a schematic flowchart of another exemplary fabrication method of an array substrate consistent with disclosed embodiments of the present disclosure.

FIG. 18 illustrates a schematic flowchart of another fabrication method of an array substrate consistent with disclosed embodiments of the present disclosure; and FIGS. 19-23 illustrate semiconductor structures corresponding to certain stages of the fabrication method of the array substrate. Referring to FIGS. 18-23, in one embodiment, the fabrication method of the array substrate may include following.

S121: Forming a gate layer on a side of the base substrate, and etching the gate layer using the second photoresist pattern as a mask to form a gate of the first transistor.

Figure 19:
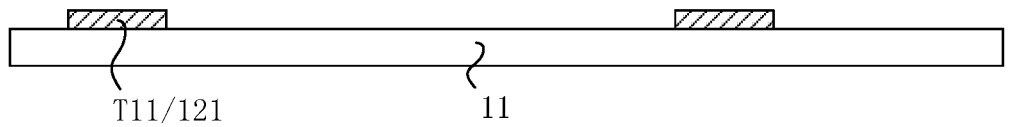
FIGS. 19-23 illustrate semiconductor structures corresponding to certain stages of an exemplary fabrication method of an array substrate consistent with various disclosed embodiments of the present disclosure.

Referring to FIG. 19, the gate layer 121 may be etched using the second photoresist pattern as a mask, to form the gate T11 of the first transistor on the side of the base substrate 11.

S122: Forming a gate insulating layer on a side of the gate layer away from the base substrate.

S123: Forming an active layer on a side of the gate insulating layer away from the base substrate, and etching the active layer using the third photoresist pattern as a mask to form an active portion of the first transistor.

Figure 20:
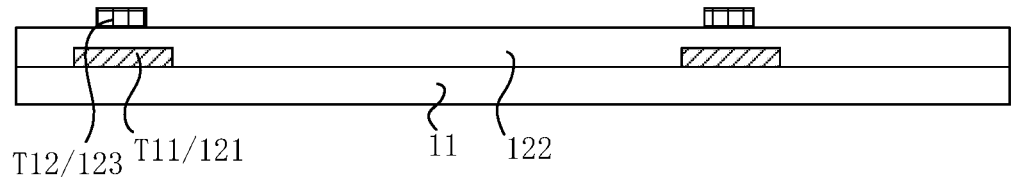

Referring to FIG. 20, a gate insulating layer 122 may be disposed on the side of the gate layer 121 away from the base substrate 11, and an active layer 123 may be disposed on the side of the gate insulating layer 122 away from the base substrate 11. The active layer 123 may be etched using the third photoresist pattern as a mask to form the active portion T12 of the first transistor on the side of the gate insulating layer 122 away from the base substrate 11.

S124: Forming a source-drain electrode layer on a side of the active layer away from the base substrate, and etching the source-drain electrode layer using the fourth photoresist pattern as a mask to form a source electrode and a drain electrode of the first transistor.

Figure 21:
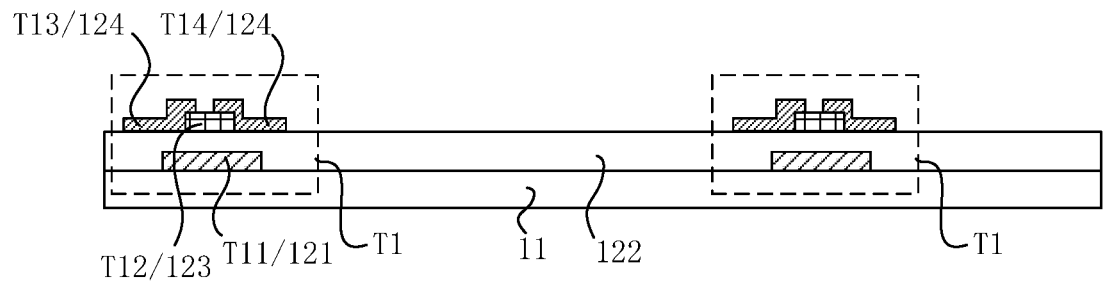

Referring to FIG. 21, the source-drain electrode layer 124 may be formed on the side of the active layer 123 away from the base substrate 11. The source-drain electrode layer 124 may be etched using the fourth photoresist pattern as a mask, to form the source electrode T13 and the drain electrode T14 of the first transistor on the side of the active layer 123 away from the base substrate 11. The gate T11, the active portion T12, the source electrode T13 and the drain electrode T14 may form the first transistor T1.

S125: Forming an interlayer insulating layer on a side of the source-drain electrode layer away from the base substrate, and etching the interlayer insulating layer using the fifth photoresist pattern as a mask to form a first through-hole, where the first through-hole may expose at least a portion of the drain electrode of the first transistor.

Figure 22:
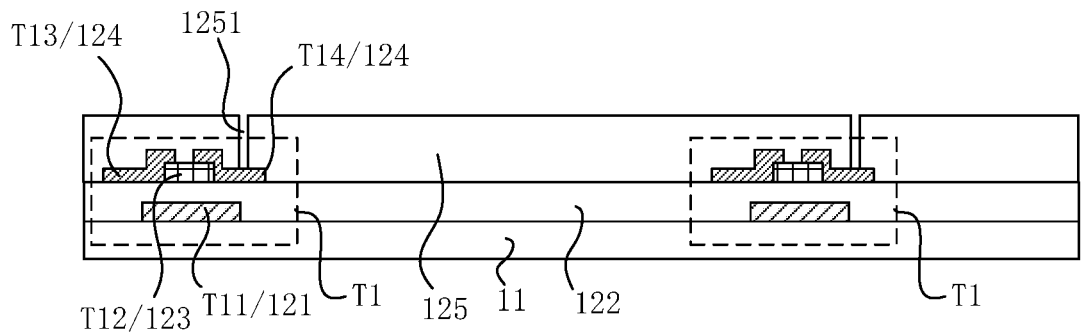

Referring to FIG. 22, an interlayer insulating layer 125 may be formed on the side of the source-drain electrode layer 124 away from the base substrate 11, and the interlayer insulating layer 125 may be etched using a fifth photoresist pattern as a mask to form the first through-hole 1251. The first through-hole 1251 may expose at least a portion of the drain electrode T14 of the first transistor T1.

S131: Forming the electrode layer on a side of the interlayer insulating layer away from the base substrate, and etching the electrode layer using the sixth photoresist pattern as a mask to form a driving electrode, where the driving electrode may be electrically connected to the drain electrode of the first transistor through the first through-hole.

Figure 23:
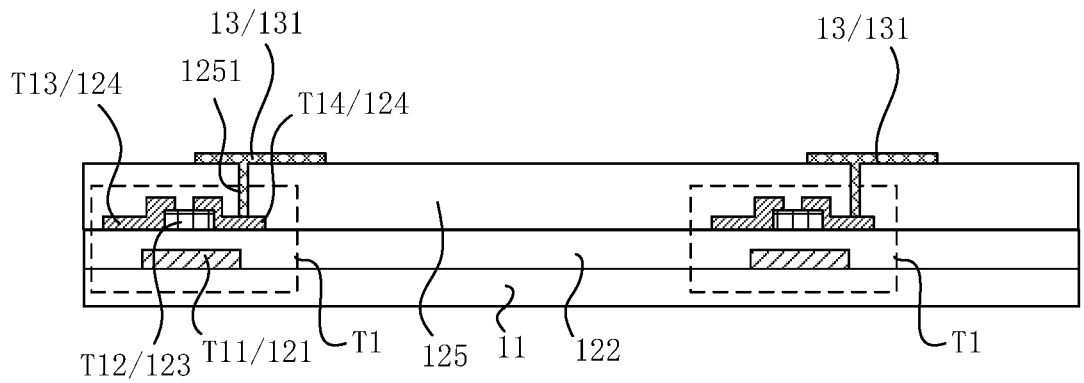

Referring to FIG. 23, the electrode layer 13 may be formed on the side of the interlayer insulating layer 125 away from the base substrate 11, and the electrode layer 13 may be etched using the sixth photoresist pattern as a mask to form the driving electrode 131. The driving electrode 131 may be electrically connected to the drain T14 of the first transistor T1 through the first through-hole 1251, thereby achieving the electrical connection between the driving electrode 131 and the first transistor T1. A voltage signal may be applied to the driving electrode 131 through the first transistor T1 electrically connected to the driving electrode 131.

Referring to FIG. 6, in one embodiment, the circuit layer 12 may further include at least one second transistor T2, and the electrode layer 13 may further include at least one heating electrode 132. The heating electrode 132 may be electrically connected to the second transistor T2. Along the direction perpendicular to the plane of the array substrate 10, at least one hydrophilic structure 30 may at least partially overlap one heating electrode 132, and at least one hydrophilic structure 30 may be disposed in a region corresponding to the heating electrode 132 in the microfluidic chip. A voltage signal may be applied to the heating electrode 132 through the corresponding second transistor T2 electrically connected to the heating electrode 132, such that the temperature of the region corresponding to the heating electrode 132 may vary. When the liquid is retained on the side of the hydrophilic structure 30 away from the array substrate 10, the temperature of the liquid retained on the side of the hydrophilic structure 30 away from the array substrate 10 may be controlled by the heating electrode 132, to detect the liquid trapped by the hydrophilic structure 30 at a specific temperature.

In one embodiment, in a digital PCR (absolute quantification of nucleic acid molecules) amplification reaction, in an ideal condition, each droplet may contain a to-be-tested DNA strand, and a reaction solvent containing a PCR reaction buffer (including four kinds of dNTP with fluorophores) and DNA polymerase. The three temperature changes in the PCR may be controlled by the heating electrode 132 under the hydrophilic structure 30, thereby achieving the PCR amplification.

Figure 24:
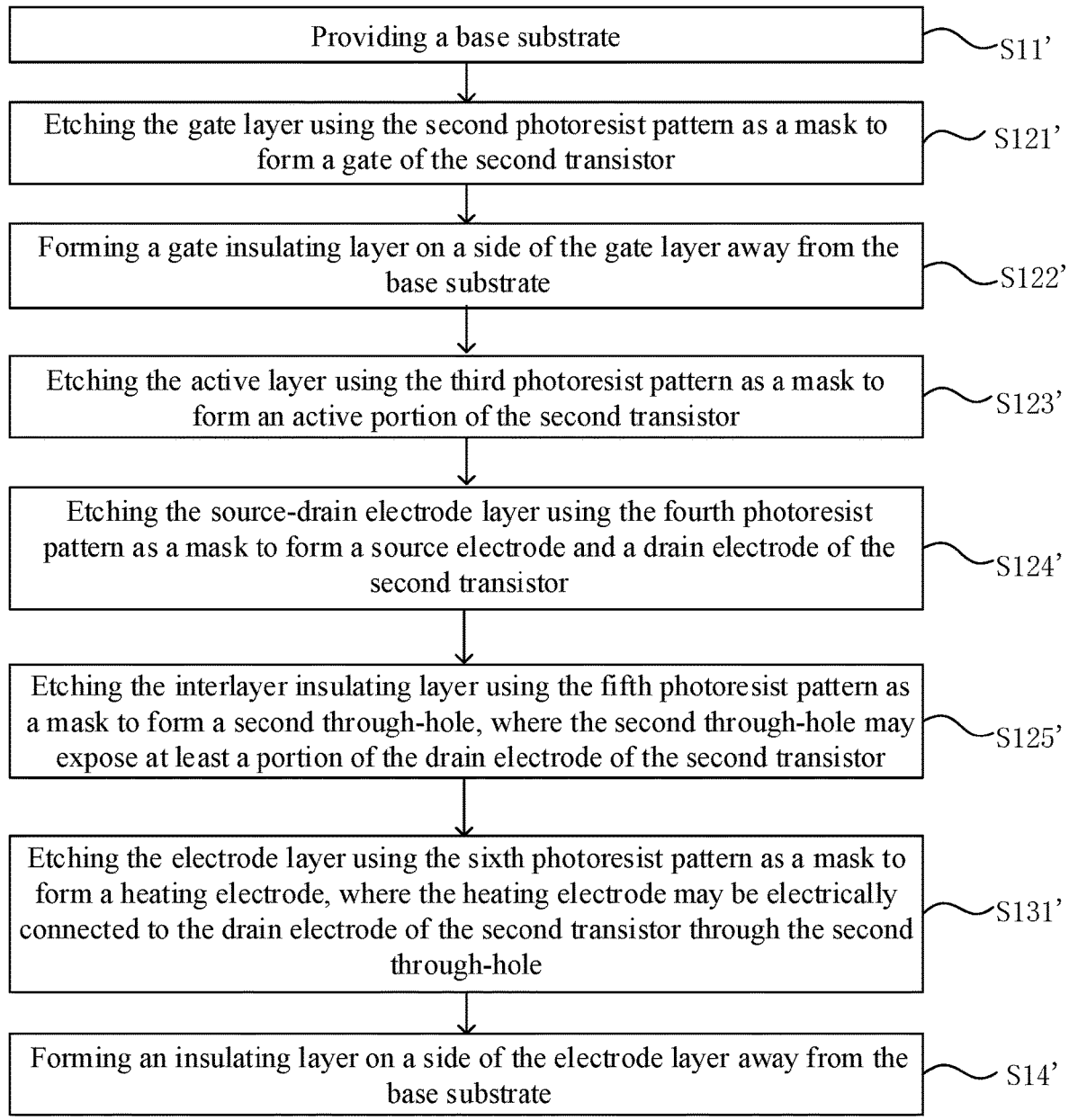
FIG. 24 illustrates a schematic flowchart of another exemplary fabrication method of an array substrate consistent with disclosed embodiments of the present disclosure.
Figure 25:
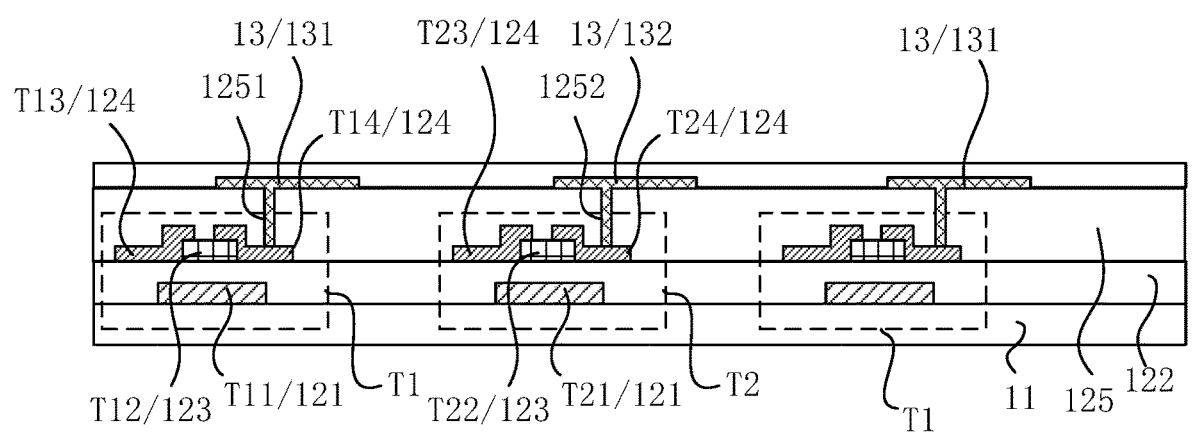
FIG. 25 illustrates a semiconductor structure corresponding to an exemplary fabrication method of an array substrate consistent with various disclosed embodiments of the present disclosure.

FIG. 24 illustrates a schematic flowchart of another fabrication method of an array substrate consistent with disclosed embodiments of the present disclosure; and FIG. 25 illustrates a semiconductor structure corresponding to the fabrication method of the array substrate. Referring to FIG. 24 and FIG. 25, in one embodiment, the fabrication method of the array substrate may further include following.

S121': Etching the gate layer using the second photoresist pattern as a mask to form the gate of the second transistor.

S123': Etching the active layer using the third photoresist pattern as a mask to form an active portion of the second transistor.

S124': Etching the source-drain electrode layer using the fourth photoresist pattern as a mask to form a source electrode and a drain electrode of the second transistor.

S125': Etching the interlayer insulating layer using the fifth photoresist pattern as a mask to form a second through-hole, where the second through-hole may expose at least a portion of the drain electrode of the second transistor.

S131': Etching the electrode layer using the sixth photoresist pattern as a mask to form a heating electrode, where the heating electrode may be electrically connected to the drain electrode of the second transistor through the second through-hole.

Referring to FIG. 25, both the gate T21 of the second transistor T2 and the gate T11 of the first transistor T1 may be formed by etching the gate layer 121 using the second photoresist pattern as a mask. Both the active portion T22 of the second transistor T2 and the active portion T12 of the first transistor T1 may be formed by etching the active layer 123 using the third photoresist pattern as a mask. The source electrode T23 and the drain electrode T24 of the second transistor T2 and the source electrode T13 and the drain electrode T14 of the first transistor T1 may be formed by etching the source-drain electrode layer 124 using the fourth photoresist pattern as a mask. In other words, the first transistor T1 and the second transistor T2 may be simultaneously formed using a same mask process, which may effectively reduce the manufacturing process.

Both the second through-hole 1252 exposing at least a portion of the drain electrode T24 of the second transistor T2 and the first through-hole 1251 exposing at least a portion of the drain electrode T14 of the first transistor T1 may be formed by etching the interlayer insulating layer 125 using the fifth photoresist pattern as a mask. Both the heating electrode 132 and the driving electrode 131 may be formed by etching the electrode layer 13 using the sixth photoresist pattern as a mask. The heating electrode 132 may be electrically connected to the drain electrode T24 of the second transistor T2 through the second through-hole 1252, thereby achieving the electrical connection between the heating electrode 132 and the second transistor T2. A voltage signal may be applied to the heating electrode 132 through the second transistor T2 electrically connected to the heating electrode 132 to adjust the temperature. In addition, the heating electrode 132 and the driving electrode 131 may be simultaneously formed using a same mask process, which may effectively reduce the manufacturing process.

The present disclosure provides a microfluidic chip and a fabrication method of the microfluidic chip. The disclosed embodiments may have following beneficial effects. In the disclosed microfluidic chip, the hydrophobic layer may include at least one through-hole. The through-hole may penetrate through the hydrophobic layer in a direction perpendicular to the plane of the array substrate. When the droplet moves through the through-hole, a bottom of the droplet may be partially retained in the through-hole. In other words, a portion of the droplet may be intercepted by the through-hole, such that liquid may be retained in the through-hole, and the intercepted liquid may be detected and observed subsequently. In addition, the bottom portion of the droplet may be intercepted by the through-hole for detection and observation without detecting and observing the entire droplet, which may effectively reduce the consumption of reagents and may effectively reduce the production cost.

Further, the microfluidic chip may include at least one hydrophilic structure. The hydrophilic structure may be located in the through-hole, and the hydrophilic structure may have desired hydrophilicity, such that the adhesion between the hydrophilic structure and the droplet may be substantially large. Through disposing the hydrophilic structure in the through-hole, when the droplet moves through the through-hole, the hydrophilic structure may stick to the bottom of the droplet, which may facilitate to increase the possibility of the bottom portion of the droplet being retained in the through-hole. In other words, the hydrophilic structure may facilitate to intercept the bottom portion of the droplet, such that the liquid may be retained on the side of the hydrophilic structure away from the array substrate, and the intercepted liquid may be detected and observed subsequently.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:
1. A microfluidic chip, comprising:
an array substrate, including:
a base substrate,
a circuit layer, disposed on a side of the base substrate, and
an electrode layer, disposed on a side of the circuit layer away from the base substrate, wherein the electrode layer includes a plurality of driving electrodes;
a hydrophobic layer, disposed on a side of the array substrate including the plurality of driving electrodes, wherein the hydrophobic layer includes at least one through-hole, and a through-hole of the at least one through-hole penetrates through the hydrophobic layer along a direction perpendicular to a plane of the array substrate; and
at least one hydrophilic structure, wherein a hydrophilic structure of the at least one hydrophilic structure is disposed in the through-hole,
wherein in a plane parallel to the base substrate, the at least one hydrophilic structure is disposed between adjacent two driving electrodes of the plurality of driving electrodes.
2. The microfluidic chip according to claim 1, wherein:
along the direction perpendicular to the plane of the array substrate, the hydrophilic structure has a height of h1, and the through-hole has a height of h2, wherein $h2>h1$.
3. The microfluidic chip according to claim 2, wherein:

$$h2-h1 \geq 1 \ \mu m.$$

4. The microfluidic chip according to claim 1, wherein:
a reaction material is disposed on a side of the hydrophilic structure away from the array substrate.
5. The microfluidic chip according to claim 4, wherein:
along the direction perpendicular to the plane of the array substrate, a sum of a height of the reaction material and a height of the hydrophilic structure is less than a height of the through-hole.
6. A microfluidic chip, comprising:
an array substrate;
a hydrophobic layer, disposed on a side of the array substrate, wherein the hydrophobic layer includes at least one through-hole, and a through-hole of the at least one through-hole penetrates through the hydrophobic layer along a direction perpendicular to a plane of the array substrate; and
at least one hydrophilic structure, wherein a hydrophilic structure of the at least one hydrophilic structure is disposed in the through-hole, wherein:
the hydrophilic structure is made of a material including one or more of silicon oxide, silicon nitride, polyvinylpyrrolidone and sodium hydroxide.
7. A microfluidic chip, comprising:
an array substrate;
a hydrophobic layer, disposed on a side of the array substrate, wherein the hydrophobic layer includes at least one through-hole, and a through-hole of the at least one through-hole penetrates through the hydrophobic layer along a direction perpendicular to a plane of the array substrate; and
at least one hydrophilic structure, wherein a hydrophilic structure of the at least one hydrophilic structure is disposed in the through-hole,
wherein the array substrate includes:
a base substrate,
a circuit layer, disposed on a side of the base substrate, wherein the circuit layer includes a plurality of first transistors,
an electrode layer, disposed on a side of the circuit layer away from the base substrate, wherein the electrode layer includes a plurality of driving electrodes, and a driving electrode of the plurality of driving electrodes is electrically connected to a first transistor of the plurality of first transistors, and an insulating layer, disposed on a side of the electrode layer away from the base substrate, wherein the hydrophobic layer is disposed on a side of the insulating layer away from the base substrate.

8. The microfluidic chip according to claim 7, wherein:
in a plane parallel to the base substrate, the at least one hydrophilic structure is disposed between adjacent two driving electrodes of the plurality of driving electrodes.

9. The microfluidic chip according to claim 8, wherein:
the circuit layer further includes at least one second transistor,
the electrode layer further includes at least one heating electrode, wherein a heating electrode of the at least one heating electrode is electrically connected to a second transistor of the at least one second transistor, and
along the direction perpendicular to the plane of the array substrate, the at least one hydrophilic structure at least partially overlaps the heating electrode.

10. The microfluidic chip according to claim 9, wherein:
the heating electrode is made of a material including a metal.

11. A fabrication method of a microfluidic chip, comprising:
forming an array substrate by:
providing a base substrate,
forming a circuit layer on a side of the base substrate, and
forming an electrode layer on a side of the circuit layer away from the base substrate, wherein the electrode layer includes a plurality of driving electrodes;
forming a hydrophilic layer on a side of the array substrate including the plurality of driving electrodes;
forming a first photoresist pattern on a side of the hydrophilic layer away from the array substrate, wherein the first photoresist pattern corresponds to a region of a to-be-formed hydrophilic structure in the hydrophilic layer;
etching the hydrophilic layer using the first photoresist pattern as a mask to form at least one hydrophilic structure;
forming a hydrophobic layer on the side of the array substrate where the at least one hydrophilic structure is formed, wherein the hydrophobic layer includes at least one through-hole, along a direction perpendicular to a plane of the array substrate, a through-hole of the at least one through-hole penetrates through the hydrophobic layer, and a hydrophilic structure of the at least one hydrophilic structure and the first photoresist pattern are located in the through-hole,
wherein, in a plane parallel to the base substrate, the at least one hydrophilic structure is disposed between adjacent two driving electrodes of the plurality of driving electrodes; and
removing the first photoresist pattern.

12. The method according to claim 11, wherein:
along the direction perpendicular to the plane of the array substrate, the hydrophilic structure has a height of h1, and the through-hole has a height of h2, wherein h2>h1.

13. The method according to claim 11, further including:
pre-embedding a reaction material on a side of the hydrophilic structure away from the array substrate.

14. The method according to claim 13, before removing the first photoresist pattern, further including:
forming a protective coating layer on a side of the hydrophobic layer away from the array substrate, wherein the protective coating layer covers the hydrophobic layer and the first photoresist pattern;
removing a portion of the protective coating layer covering the first photoresist pattern and the first photoresist pattern, to expose the hydrophilic structure;
soaking the side of the hydrophilic structure away from the array substrate in a reaction material, to pre-embed the reaction material on the side of the hydrophilic structure away from the array substrate; and
removing another portion of the protective coating layer covering the hydrophobic layer.

15. The method according to claim 14, wherein:
the protective coating layer is made of parylene.

16. The method according to claim 11, wherein:
the circuit layer includes a plurality of first transistors;
a driving electrode of the plurality of driving electrodes is electrically connected to a first transistor of the plurality of first transistors; and
forming the array substrate further includes forming an insulating layer on a side of the electrode layer away from the base substrate, wherein the hydrophilic layer is formed on a side of the insulating layer away from the base substrate.

17. The method according to claim 16, further including:
forming a gate layer on a side of the base substrate, and etching the gate layer using a second photoresist pattern as a mask to form a gate of the first transistor;
forming a gate insulating layer on a side of the gate layer away from the base substrate;
forming an active layer on a side of the gate insulating layer away from the base substrate, and etching the active layer using a third photoresist pattern as a mask to form an active portion of the first transistor;
forming a source-drain electrode layer on a side of the active layer away from the base substrate, and etching the source-drain electrode layer using a fourth photoresist pattern as a mask to form a source electrode and a drain electrode of the first transistor;
forming an interlayer insulating layer on a side of the source-drain electrode layer away from the base substrate, and etching the interlayer insulating layer using a fifth photoresist pattern as a mask to form a first through-hole, wherein the first through-hole exposes at least a portion of the drain electrode of the first transistor; and
forming the electrode layer on a side of the interlayer insulating layer away from the base substrate, and etching the electrode layer using a sixth photoresist pattern as a mask to form the driving electrode, wherein the driving electrode is electrically connected to the drain electrode of the first transistor through the first through-hole.

18. The method according to claim 17, wherein:
the circuit layer further includes at least one second transistor,
the electrode layer further includes at least one heating electrode, wherein a heating electrode of the at least one heating electrode is electrically connected to a second transistor of the at least one second transistor, and
along the direction perpendicular to the plane of the array substrate, the at least one hydrophilic structure at least partially overlaps a heating electrode of the at least one heating electrode.

19. The method according to claim 18, further including:
- etching the gate layer using the second photoresist pattern as a mask to form a gate of the second transistor;
- etching the active layer using the third photoresist pattern as a mask to form an active portion of the second transistor;
- etching the source-drain electrode layer using the fourth photoresist pattern as a mask to form a source electrode and a drain electrode of the second transistor;
- etching the interlayer insulating layer using the fifth photoresist pattern as a mask to form a second through-hole, wherein the second through-hole exposes at least a portion of the drain electrode of the second transistor; and
- etching the electrode layer using the sixth photoresist pattern as a mask to form the heating electrode, wherein the heating electrode is electrically connected to the drain electrode of the second transistor through the second through-hole.

* * * * *